(12) United States Patent
Lee et al.

(10) Patent No.: US 8,484,584 B2
(45) Date of Patent: Jul. 9, 2013

(54) SYSTEMS, METHODS AND COMPUTER PROGRAM PRODUCTS FOR FORMING PHOTOMASKS WITH REDUCED LIKELIHOOD OF FEATURE COLLAPSE, AND PHOTOMASKS SO FORMED

(75) Inventors: Mi-kyeong Lee, Suwon-si (KR); Seong-woon Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/281,787

(22) Filed: Oct. 26, 2011

(65) Prior Publication Data

US 2012/0210278 A1 Aug. 16, 2012

(30) Foreign Application Priority Data

Feb. 10, 2011 (KR) .................. 10-2011-0011926

(51) Int. Cl.
*G06F 17/50* (2006.01)
*G03F 1/00* (2006.01)
*G03C 5/00* (2006.01)

(52) U.S. Cl.
USPC .............. 716/50; 716/51; 716/52; 716/53; 716/54; 716/55; 716/56; 430/5; 430/30

(58) Field of Classification Search
USPC .................... 716/50–56; 430/5, 30
See application file for complete search history.

(56) References Cited

U.S. PATENT DOCUMENTS

| | | | | |
|---|---|---|---|---|
| 6,847,433 B2 * | 1/2005 | White et al. | | 355/72 |
| 6,855,467 B2 * | 2/2005 | Amemiya | | 430/30 |
| 7,010,434 B2 * | 3/2006 | Ashida et al. | | 702/33 |
| 7,020,866 B2 * | 3/2006 | Kamon | | 716/55 |
| 7,171,637 B2 * | 1/2007 | Stivers | | 716/52 |
| 7,188,049 B2 * | 3/2007 | Tsuchiya et al. | | 702/182 |
| 7,296,249 B2 * | 11/2007 | Rinderknecht et al. | | 716/106 |
| 7,444,616 B2 * | 10/2008 | Sandstrom et al. | | 716/53 |
| 7,454,051 B2 * | 11/2008 | Hirano et al. | | 382/144 |
| 7,488,691 B2 * | 2/2009 | Soda | | 438/725 |
| 7,504,182 B2 * | 3/2009 | Stewart et al. | | 430/5 |
| 7,521,405 B2 | 4/2009 | Zhang et al. | | |
| 7,535,549 B2 * | 5/2009 | Cherala et al. | | 355/52 |

(Continued)

FOREIGN PATENT DOCUMENTS

| | | |
|---|---|---|
| JP | 2005-217070 A | 8/2005 |
| JP | 2010-153914 A | 7/2010 |
| KR | 10-2006-0043753 A | 5/2006 |

OTHER PUBLICATIONS

Woonki et al.; "Determination of Adhesion Force of Particles on Substrate Surface using Atomic Force Microscopy"; Publication Year: 2012; Planarization/CMP Technology (ICPT 2012), International Conference on; pp. 1-6.*

(Continued)

*Primary Examiner* — Helen Rossoshek
(74) *Attorney, Agent, or Firm* — Myers Bigel Sibley & Sajovec, P.A.

(57) ABSTRACT

At least one pattern of a photomask is identified that has a likelihood of causing collapse of a microelectronic device feature that is formed using the photomask, due to surface tension of a solution that is applied to the feature during manufacture of the microelectronic device. The patterns of the photomask are then modified to reduce the likelihood of the collapse. The photomask may be formed and the photomask may be used to manufacture microelectronic devices. Related methods, systems, devices and computer program products are described.

20 Claims, 10 Drawing Sheets

U.S. PATENT DOCUMENTS

| | | | |
|---|---|---|---|
| 7,549,141 B2* | 6/2009 | Ikuta et al. | 716/51 |
| 7,617,477 B2* | 11/2009 | Ye et al. | 716/56 |
| 7,671,963 B2* | 3/2010 | Streefkerk et al. | 355/30 |
| 7,921,401 B2* | 4/2011 | Ito et al. | 716/136 |
| 8,266,558 B2* | 9/2012 | Wells | 716/55 |
| 8,279,409 B1* | 10/2012 | Sezginer et al. | 355/77 |
| 2004/0029395 A1 | 2/2004 | Zhang et al. | |
| 2005/0141761 A1* | 6/2005 | Lee et al. | 382/145 |
| 2006/0051683 A1* | 3/2006 | Sato | 430/5 |
| 2009/0155990 A1* | 6/2009 | Yanagidaira et al. | 438/584 |
| 2010/0248153 A1* | 9/2010 | Lee et al. | 430/312 |
| 2012/0258386 A1* | 10/2012 | Fu et al. | 430/5 |

OTHER PUBLICATIONS

Grundke et al.; "On the effect of cationic surfactants in the rinse to reduce pattern collapse in high aspect ratio patterning of photoresists"; Publication Year: 2005, MEMS, NANO and Smart Systems, 2005. Proceedings. 2005 International Conference on; IEEE Conference Publications; pp. 14-15.*

* cited by examiner

SYSTEMS, METHODS AND COMPUTER PROGRAM PRODUCTS FOR FORMING PHOTOMASKS WITH REDUCED LIKELIHOOD OF FEATURE COLLAPSE, AND PHOTOMASKS SO FORMED

CROSS-REFERENCE TO RELATED APPLICATION

This U.S. non-provisional patent application claims priority under 35 U.S.C. §119 to Korean Patent Application No. 10-2011-0011926, filed on Feb. 10, 2011, in the Korean Intellectual Property Office, the entire contents of which are hereby incorporated herein by reference.

BACKGROUND

Various embodiments described herein relate to microelectronic manufacturing methods that use photomasks and, more particularly, to systems, methods and computer program products for forming photomasks, and photomasks so formed.

Photomasks are widely used in microelectronic device fabrication, for example as part of a photolithography process. As the integration density of microelectronic devices continues to increase, the pattern density of photomask patterns also continues to increase. Photomasks generally are designed by designing a pattern layout and performing optical proximity correction (OPC) to modify the designed pattern to reduce optical diffraction and optical interference effects. A design verification process may also be performed to identify potential defects, such as pattern necking and/or bridging, and the patterns of the photomasks also may be modified to reduce the likelihood of such defects. Once the patterns are modified, the modified patterns are used to form a photomask and the photomask is used to manufacture microelectronic devices.

SUMMARY

According to various embodiments described herein, methods of forming a photomask include providing design patterns; determining actual patterns by using the design patterns; calculating forces relating to the actual patterns; and evaluating whether the actual patterns will collapse based on the calculated forces. The providing, the calculating and the evaluating are performed using at least one computer processor.

In some embodiments, the calculating of the forces relating to the actual patterns may include calculating a first force inherent in the actual patterns; and calculating a second external force applied to the actual patterns.

In some embodiments, the evaluating whether the actual patterns will collapse based on the calculated forces may include classifying the actual patterns by comparing the first and second forces with each other.

In some embodiments, the classifying of the actual patterns by comparing the first force with the second force may include classifying the actual patterns as safe actual patterns when the first force is greater than the second force; and classifying the actual patterns as collapsing actual patterns when the first force is less than the second force.

In some embodiments, the evaluating whether the actual patterns will collapse based on the calculated forces may include classifying the actual patterns according to a ratio between the first force and the second force.

In some embodiments, the classifying of the actual patterns according to the ratio between the first force and the second force may include classifying the actual patterns as safe actual patterns when a ratio of the second force with respect to the first force is equal to or less than a first ratio; classifying the actual patterns as collapsing actual patterns when the ratio of the second force with respect to the first force is equal to or greater than a second ratio; and classifying the actual patterns as warned actual patterns when the ratio of the second force with respect to the first force ranges between the first ratio and the second ratio.

In some embodiments, the first ratio may range from about 80% to about 90%, and the second ratio may be about 100% or more.

In some embodiments, the first force may be in proportion to an elastic force of the actual patterns.

In some embodiments, the elastic force of the actual patterns may relate to a width and a height of the actual patterns.

In some embodiments, the second force may be dependent upon characteristics of a filling material that is filled between the actual patterns during use of the photomask.

In some embodiments, the filling material may include a photoresist developing solution or a cleaning solution.

In some embodiments, the second force may be an external force based on a surface tension of the filling material to be applied to the actual patterns during use of the photomask.

In some embodiments, the external force based on the surface tension may vary depending on a temperature.

In some embodiments, the second force may be expressed by:

$$F_2 = \frac{2\gamma\cos\theta}{S}HL,$$

where $F_2$ denotes the second force, $\gamma$ denotes the surface tension, $\theta$ denotes a contact angle, $S$ denotes a distance between the actual patterns, $H$ denotes a height of the actual pattern, and $L$ denotes a length of the actual pattern.

In some embodiments, the actual patterns may be photoresist patterns, hard mask patterns, aerial image emulating patterns and/or device patterns.

In some embodiments, the methods may further include correcting the design patterns to prevent the actual patterns from collapsing, after performing the evaluating of the collapse of the actual patterns.

Photomask forming methods according to various other embodiments described herein include providing design patterns; determining actual patterns by using the design patterns; selecting an actual pattern to be evaluated among the actual patterns; selecting adjacent actual patterns adjacent to the actual pattern to be evaluated; dividing the actual pattern to be evaluated into pieces based on the adjacent actual patterns; calculating forces applied to the divided actual pattern to be evaluated by the adjacent actual patterns corresponding to a piece of the divided actual pattern to be evaluated; and evaluating whether the actual pattern to be evaluated will collapse by comparing a force inherent in the actual pattern to be evaluated with the forces applied to the divided actual pattern. The providing the determining, the selecting an actual pattern, the selecting adjacent actual patterns, the dividing, the calculating and the evaluating are performed using at least one computer processor.

In some embodiments, the calculating of the forces may include: selecting evaluation points in the divided actual pattern to be evaluated; and calculating the force at a respective evaluation point.

In some embodiments, a respective evaluation point is located at a center portion in a respective divided actual pattern to be evaluated.

A photomask may be formed according to other embodiments described herein by obtaining patterns of the photomask and identifying at least one of the patterns that has a likelihood of causing collapse of a microelectronic device feature that is formed using the photomask due to surface tension of a solution that is applied to the feature during manufacture of the microelectronic device. The patterns of the photomask are modified to reduce the likelihood of the collapse due to the surface tension of the solution that is applied to the feature during the manufacture of the microelectronic device. The obtaining, the identifying and the modifying are performed using at least one computer processor.

In other embodiments, a photomask is formed from the patterns that were modified and, in still other embodiments, the photomask that was formed is used to manufacture microelectronic devices.

Various other embodiments described herein may provide a photomask that is formed according to any of the methods described herein and/or a microelectronic device that is manufactured according to any of the methods described herein. A computer program product for designing a photomask may also be provided according to various embodiments described herein, the computer program product comprising a computer readable medium having computer readable program code executable by at least one computer processor, wherein the computer readable program code is configured to cause the at least one computer processor to perform any of the methods described herein.

BRIEF DESCRIPTION OF THE DRAWINGS

Various embodiments described herein will be more clearly understood from the following detailed description taken in conjunction with the accompanying drawings in which.

DETAILED DESCRIPTION

Figure 1:
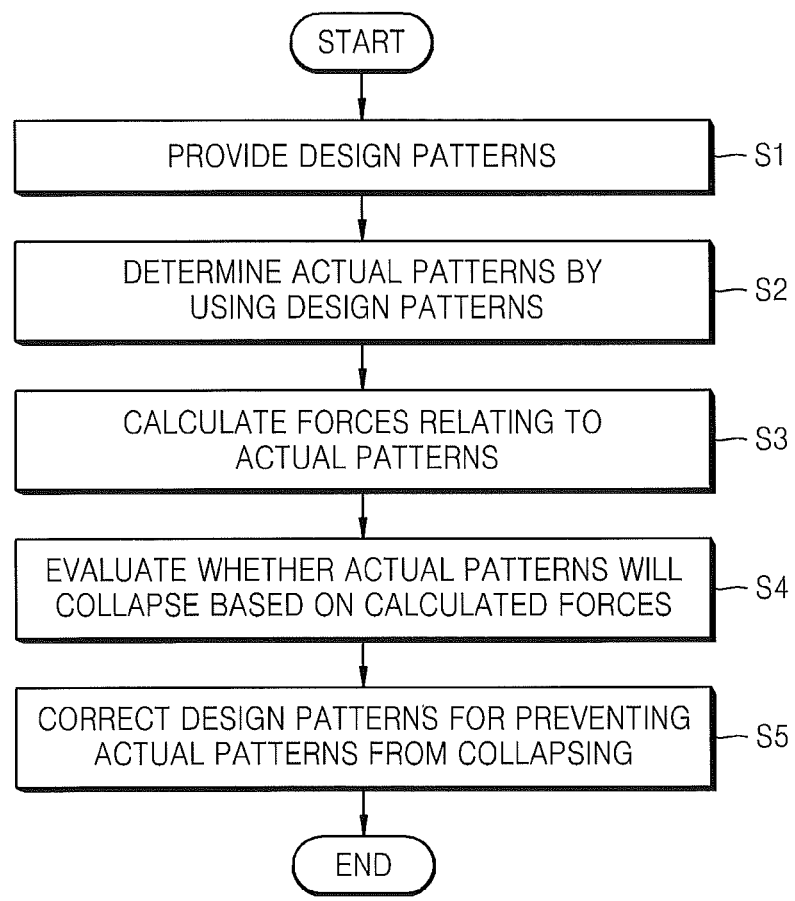
FIG. 1 is a flowchart illustrating forming a photomask according to various embodiments described herein.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element, such as a layer, a region, or a substrate, is referred to as being "on," "connected to", "coupled to" or "responsive to" another element, it may be directly on, connected, coupled or responsive to the other element or intervening elements may be present. In contrast, when an element is referred to as being "directly on", "directly connected to", "directly coupled to" or "directly responsive to" another element, there are no intervening elements present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Various embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flowchart illustrating forming a photomask according to various embodiments described herein.

Referring to FIG. 1, a photomask is formed according to these embodiments by providing design patterns (20, refer to FIG. 2) (S1), determining actual patterns (40, refer to FIG. 2) by using the design patterns (S2), calculating forces relating to the actual patterns 40 (S3), and evaluating collapse of the actual patterns based on the calculated forces (S4). The determining (S2) may be performed empirically and/or by simulation. In addition, FIG. 1 may optionally include an operation of correcting the design patterns to reduce or prevent the actual patterns from collapsing (S5) after performing the evaluating of the collapse of the actual patterns (S4). One or more, including all, of the operations of FIG. 1, may be performed using at least one computer processor.

Figure 2:
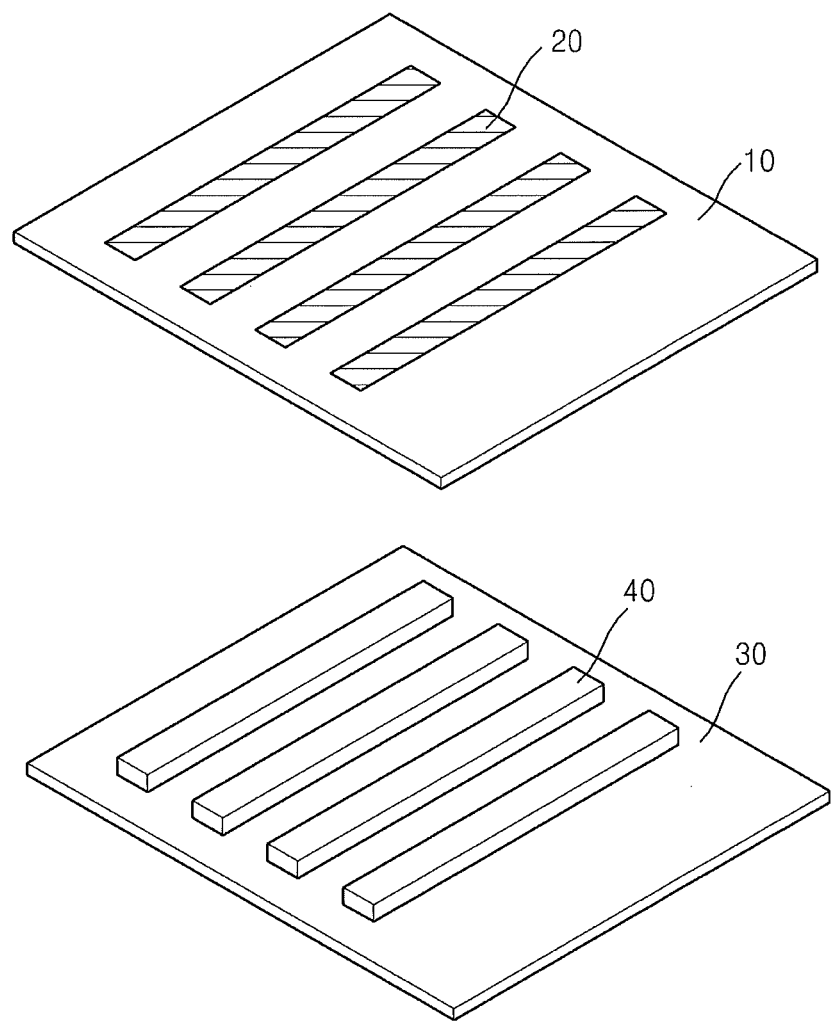
FIGS. 2 and 3 schematic diagrams illustrating forming a photomask according to various embodiments described herein.
Figure 3:
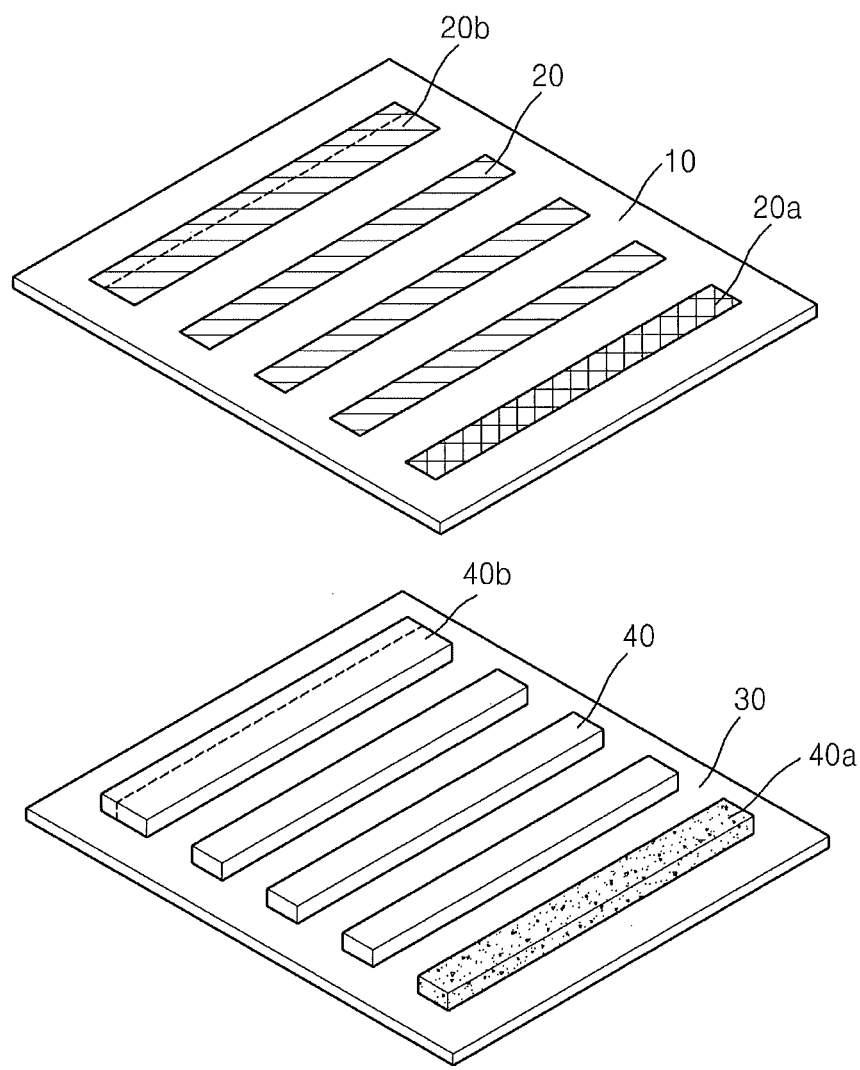

FIGS. 2 and 3 schematically illustrate forming the photomask 10 according to embodiments of FIG. 1.

Referring to FIG. 2, the photomask 10 includes the design patterns 20. The actual patterns 40 are formed on an object 30, such as a microelectronic device, by using the design patterns 20.

The photomask 10 may include quartz. The design patterns 20 are patterns formed on the photomask 10 and may include a metal such as chrome. In addition, the design patterns 20 may be formed a few times larger than the actual patterns 40.

The actual patterns 40 may be one or more features of a microelectronic device, such as photoresist patterns, hard mask patterns, aerial image emulating patterns and/or other microelectronic device patterns. The photoresist patterns may be formed by using a photoresist material that is generally used in the art. The hard mask patterns may include various materials, for example, a silicon oxide material or a silicon nitride material. The aerial image emulating patterns generally refer to images formed on the photoresist. The aerial image emulating patterns are formed by an aerial image emulator without performing an exposure process. The aerial image emulator may be an aerial image measurement system (AIMS) manufactured by Carl Zeiss, Co., or a mask inspection tool. The device patterns may include a transistor, a capacitor, or wires formed on a microelectronic substrate, for example, a semiconductor substrate such as a silicon substrate. In addition, the design patterns 20 and/or the actual patterns 40 may be formed as, for example, lines; however, various embodiments described herein are not limited to the above example. The design patterns 20 and/or the actual patterns 40 may be formed as, for example, triangles, rectangles, squares, parallelograms, rhombuses, trapezoids, semicircles, circles and/or ovals. The object 30 may be a microelectronic device that includes a substrate such as a semiconductor substrate, for example silicon.

Referring to FIG. 3, if the actual patterns 40 shown in FIG. 2 are evaluated to collapse, the design patterns 20 are modified or corrected to reduce or prevent the actual patterns 40 from collapsing. For example, an auxiliary design pattern 20a is additionally formed to form an auxiliary actual pattern 40a, or a design pattern 20b having a varied width is designed to form an actual pattern 40b having a varied width. In FIG. 3, the width of the pattern is increased; however, various embodiments described herein are not limited thereto. That is, the widths of the patterns may be reduced, or may be irregularly changed. In addition, other various ways for modifying the design patterns to reduce or prevent the actual patterns 40 from collapsing may be used.

Figure 4:
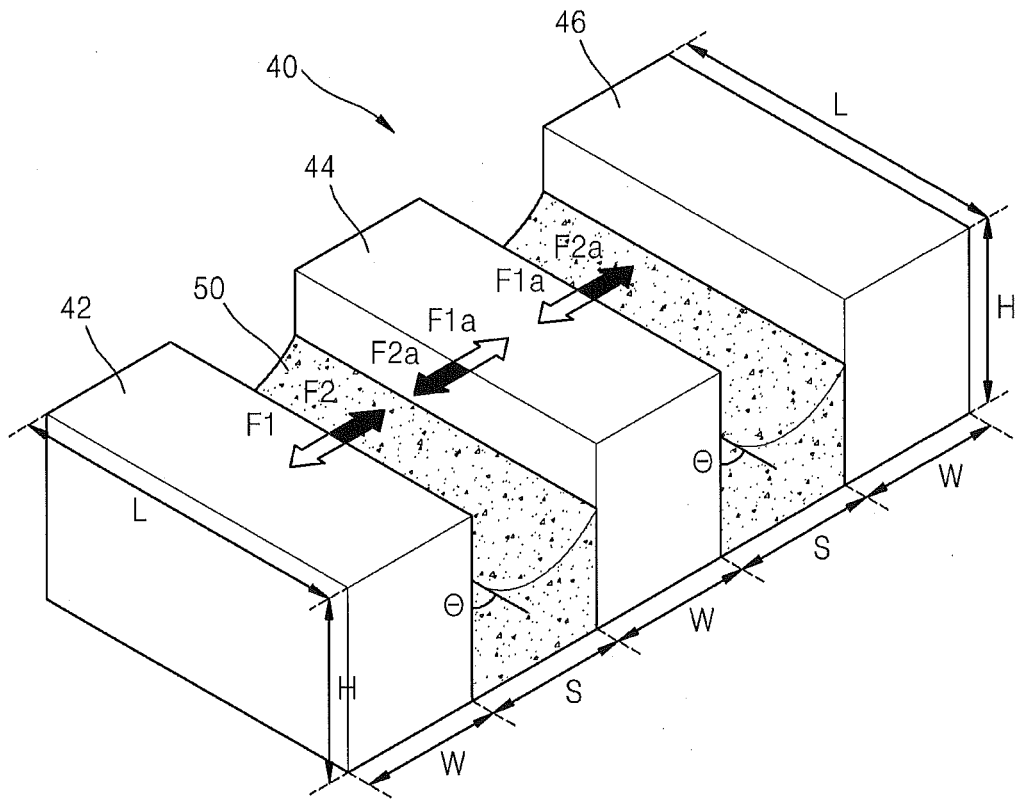
FIG. 4 is a diagram conceptually illustrating forces applied to actual patterns for illustrating embodiments of FIG. 1.

FIG. 4 is a diagram conceptually showing forces relating to the actual patterns 40 for illustrating forming the photomask of FIG. 1 according to various embodiments described herein.

Referring to FIG. 4, during manufacture of the object 30, the actual patterns 40 are formed, and filling materials 50 are filled between the actual patterns 40. The filling material 50 may be liquid, for example, a photoresist developing solution, or a cleaning solution. The filling material 50 may be filled between the actual patterns 40 with a contact angle θ. The filling material 50 may have a surface tension, and may generate an external force based on the surface tension for drawing the actual patterns 40 to one another. The surface tension may vary depending on a temperature, and accordingly, the external force based on the surface tension may vary depending on the temperature. In general, when the temperature rises, the surface tension of the filling material 50 may be reduced. For example, the surface tension of water may be 75.64 mN/m at a temperature of 0° C., 71.97 mN/m at a temperature of 25° C., 67.91 mN/m at a temperature of 50° C., and 58.85 mN/m at a temperature of 100° C. In addition, a surface tension of mercury is 487 mN/m at a temperature of 15° C., a surface tension of acetone is 23.7 mN/m at a temperature of 20° C., and a surface tension of ethanol is 22.27 mN/m at a temperature of 15° C. Also, a surfactant such as soap or a synthetic detergent is soluble in water so that the surface tension of the water is reduced. The greater the surface tension, the stronger the tensile force between molecules. Thus, it takes a long time for a solution to evaporate.

The actual patterns 40 may have an inherent force, for example, an elastic force F1. In addition, there may be an external force F2 applied to the actual patterns 40 from outside, for example, the external force F2 based on the surface tension of the filling material 50. The external force F2 may be an attraction for drawing the actual patterns 40 to one another. It may be determined whether the actual patterns 40 may collapse by using a resultant force of the elastic force F1 and the external force F2 based on the surface tension.

Forces applied to an actual pattern 42 that is located at the outermost portion among the actual patterns 40 will be considered as follows. The actual pattern 42 has the elastic force F1. The elastic force F1 may relate to a width W of the actual pattern 42. When the width W of the actual pattern 42 increases, the elastic force F1 may also increase. In addition, the external force F2 based on the surface tension is generated from the filling material 50 located between the actual pattern 42 and an actual pattern 44 adjacent to the actual pattern 42. It is determined whether the actual pattern 42 will collapse by using the resultant force of the elastic force F1 and the external force F2 based on the surface tension.

Next, forces applied to an actual pattern 44 that is located between the actual pattern 42 and the actual pattern 41 among the actual patterns 40 will be considered as follows. The actual pattern 44 has an elastic force F1a. The elastic force F1a may be the same as or different from the elastic force F1. In addition, an external force F2a based on the surface tension is generated by the filling material 50 between the actual pattern 44 and the actual pattern 42 adjacent to the actual pattern 44. Also, an external force F2b based on the surface tension is generated by the filling material 50 between the actual pattern 44 and the actual pattern 41 adjacent to the actual pattern 44. Accordingly, it is determined whether the actual pattern 44 will collapse by using the resultant force of the elastic force F1a, the external force F2a based on the surface tension, and the external force F2b based on the surface tension. Since the external force F2a based on the surface tension and the external force F2b based on the surface tension apply to opposite directions from each other, the external forces F2a and F2b may offset each other. Therefore, the probability of collapsing the actual pattern 44 may be lower than that of the actual pattern 42.

Accordingly, to reduce or prevent pattern collapse, surface tensions applied to the actual patterns within a predetermined range are calculated. After that, the external force based on the surface tension is compared with an elastic force of the actual patterns. A warning signal is generated and/or a layout of the actual patterns is corrected or modified for a region where a risk of the pattern collapse exists.

FIGS. 5 through 9 are flowcharts illustrating other embodiments of forming the photomask of FIG. 1 according to various embodiments described herein.

Figure 5:
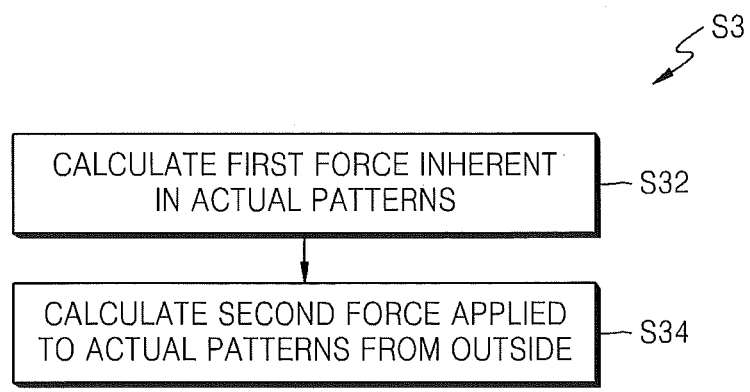
FIGS. 5 through 9 are flowcharts illustrating other embodiments of forming the photomask of FIG. 1.

Referring to FIG. 5, operation S3 of FIG. 1 for calculating the forces relating to the actual patterns may include calculating a first force inherent in the actual patterns (S32) and calculating a second force externally applied to the actual patterns (S34).

The first force may be the elastic force of the actual patterns 40 or may be any force proportional to the elastic force of the actual patterns 40, as described with reference to FIG. 4. In addition, the elastic force may be dependent upon the widths W and heights H of the actual patterns 40.

The second force may be dependent upon properties of the filling material 50 filled between the actual patterns 40, as described with reference to FIG. 4. For example, the second force may be the external force based on the surface tension of the filling material, which is applied to the actual patterns. The external force based on the surface tension may vary depending on the temperature. The second force may be expressed by following Equation 1:

$$F_2 = \frac{2\gamma \cos\theta}{S} HL, \quad (1)$$

where $F_2$ denotes the second force, $\gamma$ denotes the surface tension, $\theta$ denotes a contact angle, S denotes a distance between the actual patterns, H denotes a height of the actual pattern, and L denotes a length of the actual pattern.

Figure 6:
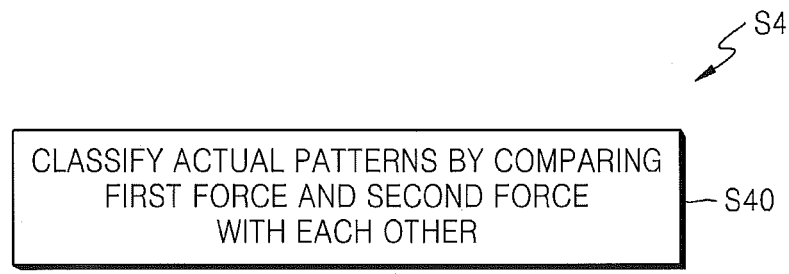

Referring to FIG. 6, the operation S4 of FIG. 4 for evaluating of the collapse of the actual patterns may include comparing the first force with the second force for classifying the actual patterns (S40). For example, if the second force is greater than the first force, the actual pattern may collapse.

Figure 7:
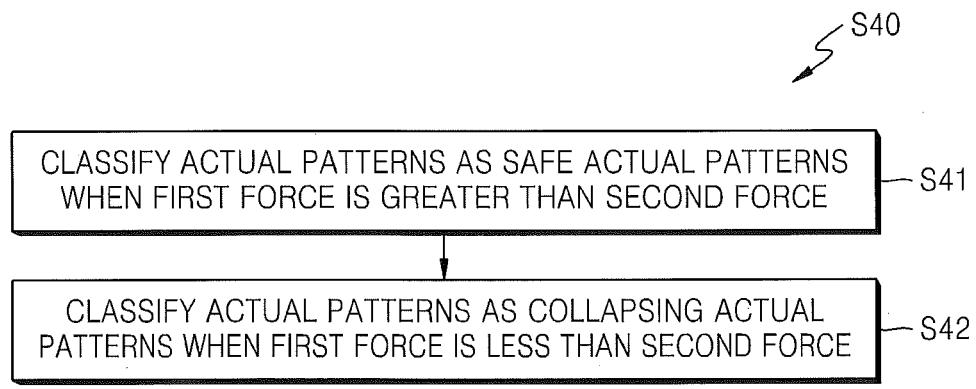

Referring to FIG. 7, the operation S40 of FIG. 6 for classifying the actual patterns by comparing the first force and the second force with each other may include an operation of classifying the actual patterns as safe actual patterns when the first force is greater than the second force (S41), and an operation of classifying the actual patterns as collapsing actual patterns when the first force is less than the second force (S42).

The actual patterns classified as the safe actual patterns may refer to the patterns having low risk of collapsing against the external force based on the surface tension. The design patterns corresponding to the actual patterns classified as the safe actual patterns may not be corrected. The actual patterns classified as the collapsing actual patterns may refer to the patterns having high risk of collapsing against the external force based on the surface tension. The design patterns corresponding to the actual patterns classified as the collapsing actual patterns may be corrected.

Figure 8:
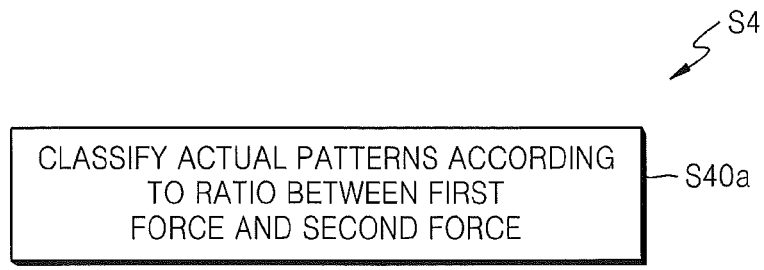

Referring to FIG. 8, the operation S4 of FIG. 4 for evaluating of the collapse of the actual patterns based on the calculated forces may include an operation of classifying the actual patterns according to a ratio between the first force and the second force (S40a).

Figure 9:
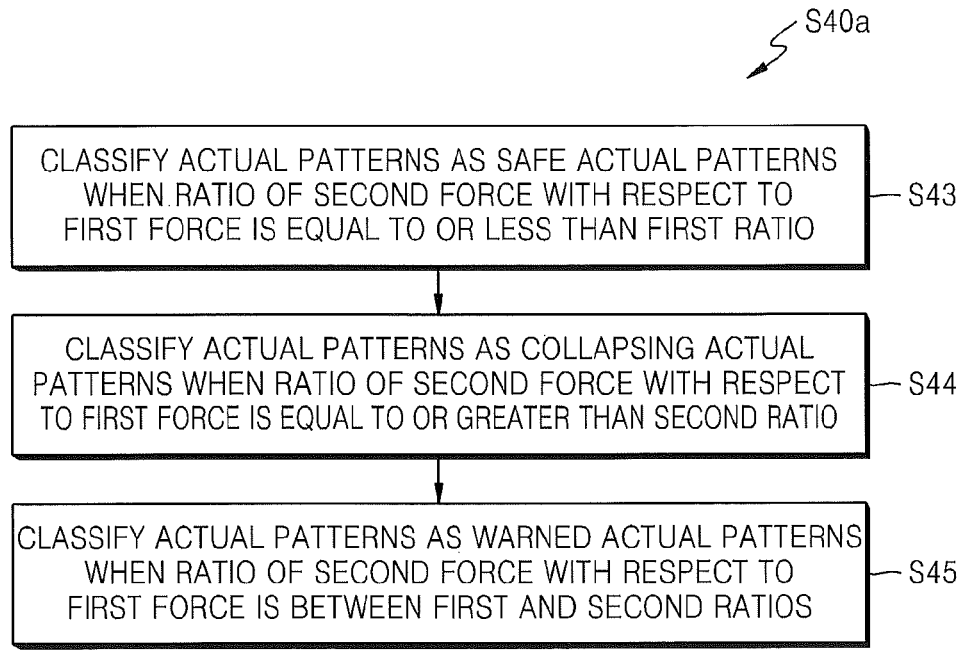

Referring to FIG. 9, the operation S40a of FIG. 8 for classifying the actual patterns according to the ratio between the first force and the second force may include an operation of classifying the actual patterns as safe actual patterns when a ratio of the second force with respect to the first force is equal to or less than a first ratio (S43), an operation of classifying the actual patterns as collapsing actual patterns when a ratio of the second force with respect to the first force is equal to or greater than a second ratio (S44), and an operation of classifying the actual patterns as warned actual patterns when the ratio of the second force with respect to the first force is between the first ratio and the second ratio (S45).

The first ratio may be, for example, between about 80% and about 90%, and the second ratio may be, for example, about 100% (that is, the first force and the second force are equal to each other) or more. These ranges of the first ratio and the second ratio are examples, and various embodiments described herein are not limited to the above examples.

The actual patterns classified as the safe actual patterns may refer to the patterns having low risks of collapsing against the external force based on the surface tension. The design patterns corresponding to the actual patterns classified as the safe actual patterns may not be corrected. The actual patterns classified as the collapsing actual patterns may refer to the patterns having high risk of collapsing against the external force based on the surface tension. The design patterns corresponding to the actual patterns classified as the collapsing actual patterns may be corrected. The actual patterns classified as the warned actual patterns may refer to the patterns having risk of collapsing against the external force based on the surface tension between that of the safe actual patterns and that of the collapsing actual patterns. The design patterns corresponding to the warned actual patterns may not be corrected, or may be corrected for reducing or preventing the actual patterns from collapsing due to other external forces that are not examined.

Figure 10:
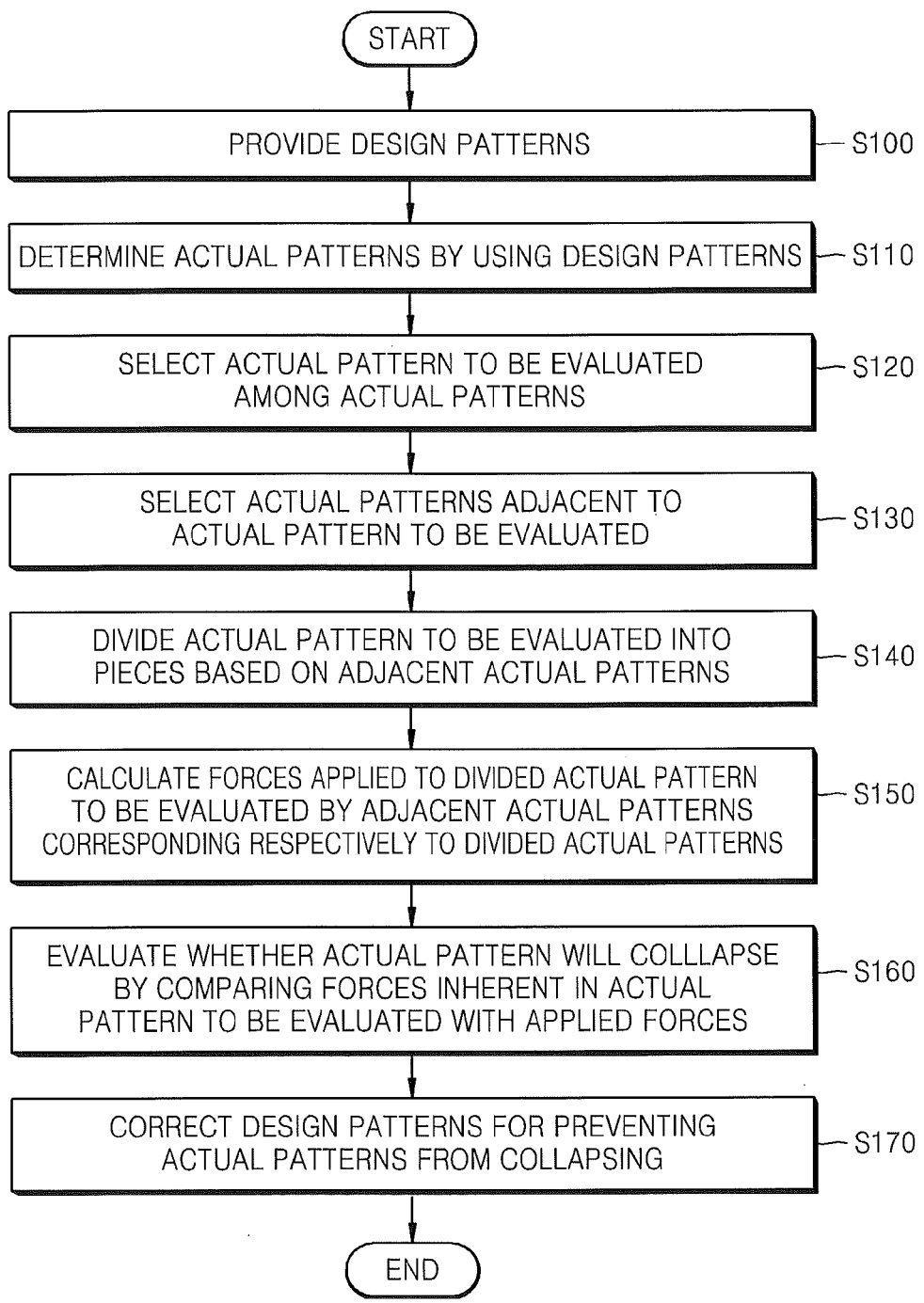
FIG. 10 is a flowchart illustrating forming a photomask according to various embodiments described herein.
Figure 11:
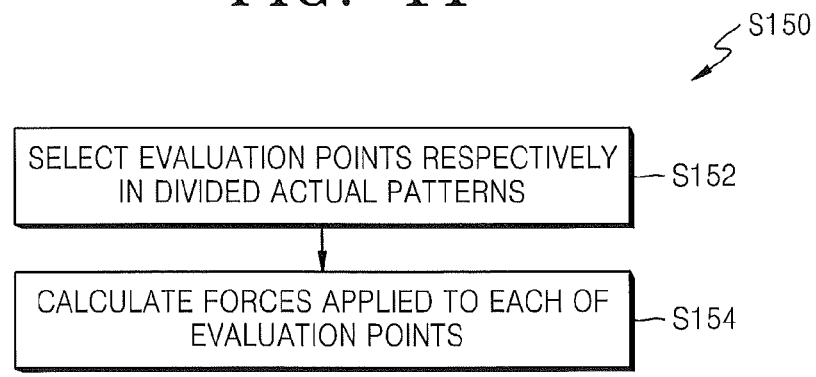
FIG. 11 is a flowchart illustrating other embodiments of forming the photomask of FIG. 10.
Figure 12:
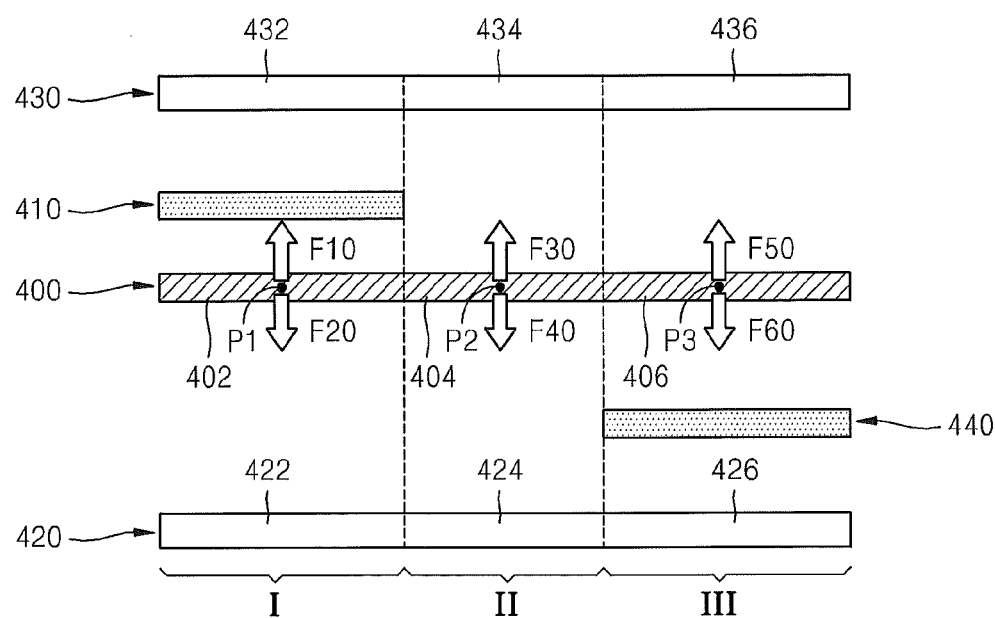
FIG. 12 is a diagram conceptually showing forces relating to actual patterns for illustrating embodiments of FIG. 10.
Figure 13:
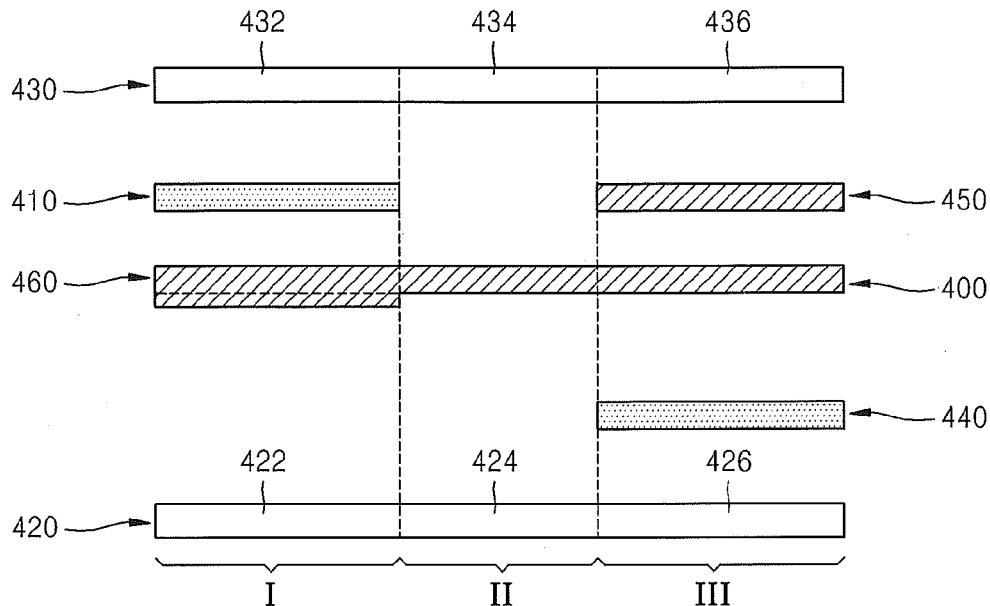
FIG. 13 is a diagram showing corrected actual patterns that are obtained by correcting the actual patterns of FIG. 12.

FIG. 10 is a flowchart illustrating forming a photomask according to various other embodiments described herein. FIG. 11 is a flowchart illustrating embodiments of forming the photomask of FIG. 10. FIG. 12 is a diagram conceptually showing forces relating to actual patterns for illustrating the forming the photomask of FIG. 10. FIG. 13 is a diagram showing corrected actual patterns that are obtained by correcting the actual patterns of FIG. 12.

Comparing embodiments of FIG. 10 with embodiments described with reference to FIG. 1, embodiments of FIG. 10 may apply where patterns adjacent to a selected actual pattern are different from each other. Thus, descriptions will not be provided for the same components as those of the above embodiments.

Referring to FIG. 10, forming a photomask includes providing design patterns (S100), forming actual patterns by using the design patterns (S110), selecting an actual pattern to be evaluated among the actual patterns (S120), selecting actual patterns adjacent to the actual pattern to be evaluated (S130), dividing the actual pattern to be evaluated into pieces based on the adjacent actual patterns (S140), calculating forces applied to the divided actual patterns to be evaluated by the adjacent actual patterns corresponding to the divided actual patterns to be evaluated (S150), and evaluating the collapse of the actual patterns to be evaluated by comparing forces inherent in the actual patterns to be evaluated with the forces (S160). In addition, these embodiments may optionally include correcting the design patterns corresponding to the actual patterns to be evaluated for preventing the actual patterns from collapsing (S170) after performing operation S160 for evaluating the collapse of the actual patterns to be evaluated.

Here, the force inherent in the actual pattern to be evaluated may correspond to the elastic force that is described in the above embodiments, and the force may correspond to the external force based on the surface tension.

Referring to FIG. 11, the operation S150 of FIG. 10 for calculating the forces may include an operation of selecting an evaluating point on a respective one of the actual patterns to be evaluated (S152), and calculating the force at a respective evaluation point (S154). Here, the evaluation points may be located at a center portion in a respective one of the divided actual patterns to be evaluated. However, locations of the evaluation points are examples, and the various embodiments described herein are not limited thereto.

Referring to FIG. 12, first, second, third, and fourth adjacent patterns 410, 420, 430, and 440 are disposed around an actual pattern 400 to be evaluated. The actual pattern 400 to be evaluated may be selected in the operation S120, and the first through fourth adjacent actual patterns 410, 420, 430, and 440 may be selected in the operation S130. In addition, the actual pattern 400 to be evaluated is arbitrarily selected, and the various embodiments described herein are not limited thereto. That is, the first through fourth adjacent actual patterns 410, 420, 430, and 440 may be selected as the actual patterns to be evaluated.

The actual pattern 400 to be evaluated may be divided into pieces or regions based on the first through fourth adjacent actual patterns 410, 420, 430, and 440. The divided regions may include a first region I, a second region II, and a third region III.

In the first region I, a first force F10 may be generated on a first portion 402 of the actual pattern 400 with respect to the first adjacent actual pattern 410. In addition, a second force F20 may be generated on the first portion 402 of the divided actual pattern 400 to be evaluated with respect to a part of the second adjacent actual pattern 420, that is, a first portion 422 of the second adjacent actual pattern 420, which is included in the first region I. The first force F10 and the second force F20 may be evenly applied to the entire first portion 402 of the actual pattern 400 to be evaluated. Otherwise, it may be assumed that the first and second forces F10 and F20 are applied to a first evaluation point P1 in the first portion 402 of the actual pattern 400 to be evaluated. The first evaluation point P1 may be located at a center portion of the first portion 402 of the actual pattern 400. The first and second forces F10 and F20 may be the second force that is described above. The first force F10 and the second force F20 may be applied to opposite directions to each other. The first force F10 may be an external force based on a surface tension of a filling material that is filled between the first portion 402 of the actual pattern 400 to be evaluated and the first adjacent actual pattern 410. The second force F20 may be an external force based on a surface tension of a filling material that is filled between the first portion 402 of the actual pattern 400 to be evaluated and the first portion 422 of the second adjacent actual pattern 420. The first and second forces F10 and F20 may be calculated by using above Equation 1.

As shown in FIG. 12, a distance between the first portion 402 of the actual pattern 400 to be evaluated and the first adjacent actual pattern 410 is less than a distance between the first portion 402 of the actual pattern 400 to be evaluated and the first portion 422 of the second adjacent actual pattern 420, and thus, the first force F10 may be greater than the second force F20. It may be considered that there is no force between the first portion 402 of the actual pattern 400 to be evaluated and a first portion 432 of the third adjacent actual pattern 430 because they are blocked from each other by the first adjacent actual pattern 410.

In the second region II, a third force F30 may be generated on the second portion 404 of the divided actual pattern 400 to be evaluated with respect to a part of the third adjacent actual pattern 430, that is, a second portion 434 of the third adjacent actual pattern 430, which is included in the second region II. In addition, a fourth force F40 may be generated on the second portion 404 of the divided actual pattern 400 to be evaluated with respect to a part of the second adjacent actual pattern 420, that is, a second portion 424 of the second adjacent actual pattern 420, which is included in the second region II. The third and fourth forces F30 and F40 may be evenly applied to the entire second portion 404 of the actual pattern 400 to be evaluated. Otherwise, it may be assumed that the third and fourth forces F30 and F40 are applied to a second evaluation point P2 in the second portion 404 of the actual pattern 400 to be evaluated. The second evaluation point P2 may be located at a center portion of the second portion 404 of the actual pattern 400 to be evaluated.

The third and fourth forces F30 and F40 may be the second force that is described above. The third force F30 and the fourth force F40 may be applied to opposite directions to each other. The third force F30 may be an external force based on a surface tension of a filling material that is filled between the second portion 404 of the actual pattern 400 to be evaluated and the third adjacent actual pattern 430. The fourth force F40 may be an external force based on a surface tension of a filling material that is filled between the second portion 404 of the actual pattern 400 to be evaluated and the second portion 424 of the second adjacent actual pattern 420. The third and fourth forces F30 and F40 may be calculated by using above Equation 1.

In the third region III, a fifth force F50 may be generated on the third portion 406 of the divided actual pattern 400 to be evaluated with respect to a part of the third adjacent actual pattern 430, that is, a third portion 436 of the third adjacent actual pattern 430, which is included in the third region III. In addition, a sixth force F60 may be generated on the third portion 406 of the divided actual pattern 400 to be evaluated with respect to the fourth adjacent actual pattern 440. The fifth and sixth forces F50 and F60 may be evenly applied to the entire third portion 406 of the actual pattern 400 to be evaluated. Otherwise, it may be assumed that the fifth and sixth forces F50 and F60 are applied to a third evaluation point P3 in the third portion 406 of the actual pattern 400 to be evaluated. The third evaluation point P3 may be located at a center portion in the third portion 406 of the actual pattern 400 to be evaluated.

The fifth and sixth forces F50 and F60 may be the second force that is described above. The fifth force F50 and the sixth force F60 may be applied to opposite directions to each other. The fifth force F50 may be an external force based on a surface tension of a filling material that is filled between the third portion 406 of the actual pattern 400 to be evaluated and the third portion 436 of the third adjacent actual pattern 430. The sixth force F60 may be an external force based on a surface tension of a filling material that is filled between the third portion 406 of the actual pattern 400 to be evaluated and the fourth adjacent actual pattern 440. The fifth and sixth forces F50 and F60 may be calculated by using above Equation 1.

As shown in FIG. 12, a distance between the third portion 406 of the actual pattern 400 to be evaluated and the fourth adjacent actual pattern 440 is less than a distance between the third portion 406 of the actual pattern 400 to be evaluated and the third portion 436 of the third adjacent actual pattern 430, and thus, the sixth force F60 may be greater than the fifth force F50. It may be considered that there is no force between the third portion 406 of the actual pattern 400 to be evaluated and the third portion 436 of the third adjacent actual pattern 430 because they are blocked from each other by the fourth adjacent actual pattern 440.

Next, when the first through sixth forces F10, F20, F30, F40, F50, and F60 are summed, an entire force generated on the actual pattern 400 to be evaluated may be calculated. It is evaluated whether the actual pattern may collapse by comparing the entire force with the force inherent in the actual pattern 400 to be evaluated, for example, the elastic force.

In addition, the above operations may be repeatedly performed with respect to other actual patterns after setting the other actual patterns as the actual patterns to be evaluated. The above operations may be performed with respect to all of the actual patterns. However, various embodiments described herein are not limited thereto. The evaluation results may be accumulated in a database.

Next, the design patterns corresponding to the actual patterns 400 to be evaluated may be corrected for reducing or preventing the actual patterns 400 to be evaluated from collapsing.

FIG. 13 shows corrected actual patterns. As an example of correction, an auxiliary pattern 450 may be additionally formed on a location that is opposite to the applied direction of the force so that the force (the sixth force F60 in FIG. 13) based on the surface tension may be offset. Otherwise, as another example of correction, a portion 460 may be formed by increasing a thickness of at least a part of the actual pattern 400 to be evaluated so that the elastic force of the actual pattern 400 may be increased. However, various embodiments described herein are not limited to the above examples, and other various ways for reducing or preventing the actual pattern 400 to be evaluated from collapsing may be used.

After forming the photomask according to any of the embodiments described herein, an optical proximity correction (OPC) may be performed with respect to the photomask. The OPC may be a model-based OPC that applies a single model to full-chip, or may be a rule-based OPC that applies a single kind of rule to full-chip. Also, forming the photomask according to any of the embodiments described herein may be executed after performing the OPC. Thereafter, the photomask that was formed may be used to manufacture microelectronic devices.

Figure 14:
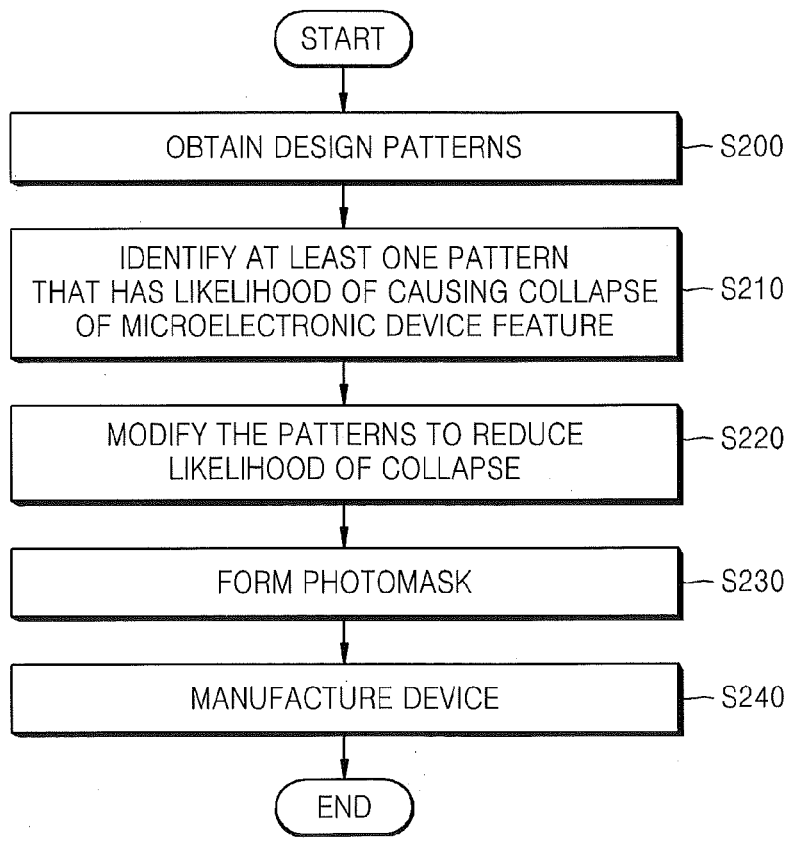
FIG. 14 is a flowchart of operations that may be performed to form a photomask according to various other embodiments described herein.

FIG. 14 is a flowchart of operations that may be performed to form a photomask according to various other embodiments described herein. Referring to FIG. 14, at Block S200, design patterns of the photomask may be obtained, for example by generating the design patterns or by obtaining the design patterns from a photomask design system. At Block S210, at least one of the patterns is identified that has a likelihood of causing collapse of a microelectronic device feature that is formed using the photomask, due to surface tension of a solution that is applied to the feature during manufacture of the microelectronic device. Any of the techniques described above and/or other techniques may be used to identify the at least one pattern. At Block S220, the patterns of the photomask are modified to reduce the likelihood of the collapse due to the surface tension of the solution that is applied to the feature during manufacture of the microelectronic device. Any of the techniques described above and/or any other techniques may be used to modify the patterns to reduce the likelihood of collapse. Any or all of the obtaining, the identifying and the modifying of Blocks S200-S220 may be performed using at least one computer processor.

Optionally, at Block S230, a photomask is formed from the patterns that were modified and, optionally, at Block S240, the photomask that was formed is used to manufacture microelectronic devices.

Figure 15:
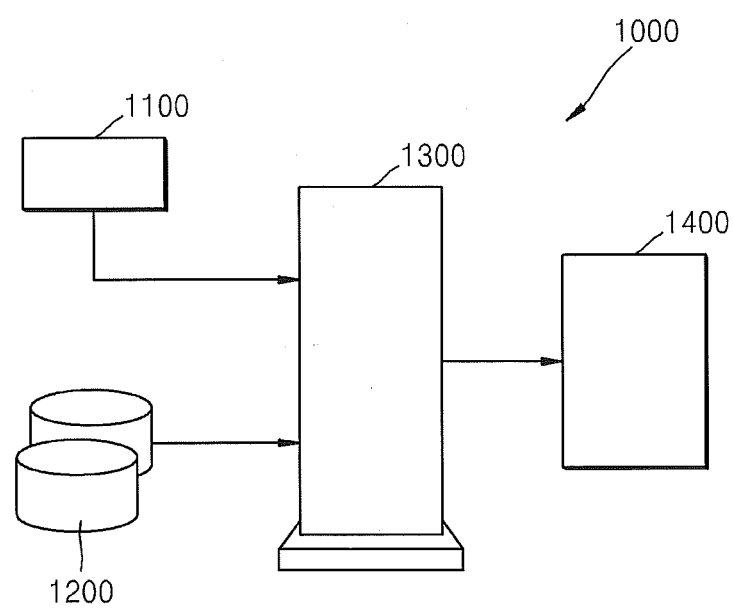
FIG. 15 is a schematic diagram showing an imaging system that can use a photomask according to various embodiments described herein.

FIG. 15 is a schematic diagram showing an imaging system 1000 for forming the photomask according to various embodiments described herein.

Referring to FIG. 15, a computer system 1300 for forming the photomask according to various embodiments described herein may be a workstation that is generally used. The computer system 1300 may be a stand-alone type or a network type, may include at least one computer processor, for example a single or a multi-processor for performing calculations, and may be a parallel computing system.

The computer system 1300 executes a series of executable instructions that are stored in a program storage medium 1100, for example, a compact disk (CD) or a digital versatile disk (DVD), or transferred through wired/wireless communication network such as Internet. The computer system 1300 receives files including information about the design patterns or a layout of the photomask from a file storage 1200 storing information about the design patterns, for example, a database or other storage media, and executes instructions for reading the information. The computer system 1300 performs, for example, the operations of evaluating whether the actual patterns will collapse and/or the operation of correcting the design patterns for preventing the actual patterns from collapsing, and/or operations according to various embodiments described herein. Then, the computer system 300 generates a file including the information about the operations. In addition, the photomask layout is transferred to a mask recording device 1400, and then, the photomask is fabricated. The mask 1400 may then be used to fabricate microelectronic devices using well known microelectronic fabrication techniques.

The imaging system 1000 may include a mechanism for providing the design patterns, a mechanism for forming the actual patterns by using the design patterns, a mechanism for calculating the forces relating to the actual patterns, and a mechanism for evaluating whether the actual patterns will collapse based on the calculated forces. In addition, the imaging system 1000 may optionally include a mechanism for correcting the design patterns for preventing the actual patterns from collapsing.

Various embodiments are described herein with reference to block diagrams and/or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer processor circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

These computer program instructions may also be stored in a computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/Blu-ray™).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks.

Accordingly, the invention may be embodied in hardware and/or in software (including firmware, resident software, micro-code, etc.) that runs on a processor such as a digital signal processor, which may collectively be referred to as "circuitry," "a module" or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of forming a photomask, the method comprising:
    providing design patterns;
    determining actual patterns by using the design patterns;
    calculating forces relating to the actual patterns; and
    evaluating whether the actual patterns will collapse based on the calculated forces,
    wherein the providing, the determining, the calculating and the evaluating are performed using at least one computer processor,
    wherein the calculating comprises calculating a first force inherent in the actual patterns and calculating a second force externally applied to the actual patterns,
    wherein the evaluating comprises classifying the actual patterns by comparing the first and second forces with each other, and
    wherein the classifying comprises:
    classifying the actual patterns as safe actual patterns when the first force is greater than the second force; and
    classifying the actual patterns as collapsing actual patterns when the first force is less than the second force.

2. The method of claim 1 further comprising:
    forming the photomask.

3. The method of claim 2 further comprising:
    using the photomask that was formed to manufacture microelectronic devices.

4. A microelectronic device that is manufactured according to the method of claim 3.

5. A computer program product for forming a photomask, the computer program product comprising a non-transitory computer-readable medium having computer-readable program code executable by the at least one computer processor, the computer-readable program code being configured to cause the at least one computer processor to perform the method of claim 1.

6. A method of forming a photomask, the method comprising:
    providing design patterns;
    determining actual patterns by using the design patterns;
    calculating forces relating to the actual patterns; and
    evaluating whether the actual patterns will collapse based on the calculated forces,
    wherein the providing, the determining, the calculating and the evaluating are performed using at least one computer processor,
    wherein the calculating comprises calculating a first force inherent in the actual patterns and calculating a second force externally applied to the actual patterns, and
    wherein the evaluating comprises:
    classifying the actual patterns according to a ratio between the first force and the second force.

7. The method of claim 6, wherein the classifying the actual patterns according to the ratio between the first force and the second force comprises:
   classifying the actual patterns as safe actual patterns when a ratio of the second force with respect to the first force is equal to or less than a first ratio;
   classifying the actual patterns as collapsing actual patterns when the ratio of the second force with respect to the first force is equal to or greater than a second ratio; and
   classifying the actual patterns as warned actual patterns when the ratio of the second force with respect to the first force ranges between the first ratio and the second ratio.

8. The method of claim 7, wherein the first ratio ranges from about 80% to about 90%, and the second ratio is about 100% or more.

9. The method of claim 6, wherein the first force is in proportion to an elastic force of the actual patterns.

10. The method of claim 9, wherein the elastic force of the actual patterns relates to a width and a height of the actual patterns.

11. The method of claim 6, wherein the second force is dependent upon characteristics of a filling material that is filled between the actual patterns during use of the photomask.

12. The method of claim 11, wherein the second force is an external force based on a surface tension of the filling material to be applied to the actual patterns during use of the photomask.

13. The method of claim 6 further comprising:
   forming the photomask.

14. The method of claim 13 further comprising:
   using the photomask that was formed to manufacture microelectronic devices.

15. A microelectronic device that is manufactured according to the method of claim 14.

16. A computer program product for forming a photomask, the computer program product comprising a non-transitory computer-readable medium having computer-readable program code executable by the at least one computer processor, the computer-readable program code being configured to cause the at least one computer processor to perform the method of claim 6.

17. A method of forming a photomask, the method comprising:
   providing design patterns;
   determining actual patterns by using the design patterns;
   calculating forces relating to the actual patterns; and
   evaluating whether the actual patterns will collapse based on the calculated forces,
   wherein the providing, the determining, the calculating and the evaluating are performed using at least one computer processor,
   wherein the calculating comprises calculating a first force inherent in the actual patterns and calculating a second force externally applied to the actual patterns,
   wherein the evaluating comprises classifying the actual patterns by comparing the first and second forces with each other, and
   wherein the second force is expressed by:

$$F_2 = \frac{2\gamma\cos\theta}{S}HL$$

where $F_2$ denotes the second force, $\gamma$ denotes the surface tension, $\theta$ denotes a contact angle, $S$ denotes a distance between the actual patterns, $H$ denotes a height of the actual pattern, and $L$ denotes a length of the actual pattern.

18. The method of claim 17 further comprising:
   forming the photomask.

19. The method of claim 18 further comprising:
   using the photomask that was formed to manufacture microelectronic devices.

20. A microelectronic device that is manufactured according to the method of claim 19.

* * * * *